United States Patent
Franck et al.

(10) Patent No.: US 11,070,214 B1
(45) Date of Patent: Jul. 20, 2021

(54) TEST CIRCUIT FOR A DIGITAL PHASE-LOCKED LOOP

(71) Applicant: MELLANOX TECHNOLOGIES DENMARK APS, Roskilde (DK)

(72) Inventors: Thorkild Franck, Roskilde (DK); Ulrik S. Wismar, Kalundborg (DK); Ran Sela, Givat Shmuel (IL)

(73) Assignee: MELLANOX TECHNOLOGIES DENMARK APS, Roskilde (DK)

( * ) Notice: Subject to any disclaimer, the term of this patent is extended or adjusted under 35 U.S.C. 154(b) by 0 days.

(21) Appl. No.: 17/069,894

(22) Filed: Oct. 14, 2020

(51) Int. Cl.
 *H03L 7/085* (2006.01)
 *H03L 7/099* (2006.01)

(52) U.S. Cl.
 CPC ............. *H03L 7/085* (2013.01); *H03L 7/099* (2013.01)

(58) Field of Classification Search
 CPC ................................ H03L 7/085; H03L 7/099
 USPC .................... 327/147–149, 156–158
 See application file for complete search history.

(56) References Cited

U.S. PATENT DOCUMENTS

| | | | |
|---|---|---|---|
| 5,295,079 A * | 3/1994 | Wong | H03L 7/0991 714/715 |
| 6,557,117 B1 | 4/2003 | Wu et al. | |
| 7,168,020 B2 | 1/2007 | Chen et al. | |
| 7,308,372 B2 * | 12/2007 | Rifani | G01R 29/0273 327/149 |
| 7,323,916 B1 * | 1/2008 | Sidiropoulos | H03L 7/081 327/147 |
| 7,397,882 B2 * | 7/2008 | Yokokura | H03L 7/0993 327/147 |
| 8,872,558 B1 * | 10/2014 | Rey | H03L 7/10 327/159 |
| 10,277,231 B1 * | 4/2019 | Lautzenhiser | H03L 7/083 |
| 10,784,872 B1 * | 9/2020 | Tsai | H03L 7/099 |
| 2003/0102926 A1 * | 6/2003 | Hsieh | H03K 5/1565 331/74 |
| 2006/0033582 A1 * | 2/2006 | Staszewski | H03L 7/085 331/16 |
| 2008/0042756 A1 * | 2/2008 | Waheed | H03B 5/04 331/16 |
| 2008/0191746 A1 * | 8/2008 | Friedman | H03L 7/087 327/5 |
| 2009/0079719 A1 * | 3/2009 | Lee | H03L 7/0891 345/204 |
| 2009/0195276 A1 * | 8/2009 | Griffiths | H03L 7/095 327/157 |
| 2009/0289677 A1 * | 11/2009 | Mizukane | H03L 7/10 327/158 |

(Continued)

*Primary Examiner* — Adam D Houston
(74) *Attorney, Agent, or Firm* — Kligler & Associates Patent Attorneys Ltd

(57) ABSTRACT

An Integrated Circuit (IC) includes a digital phase-locked loop (DPLL) circuit and DPLL Diagnostics circuitry (DPLL-DC). The DPLL circuit includes an oscillator, a digital phase detector and a digital feedback bus (DPLL-DFB). The oscillator is configured to generate an output signal. The digital phase detector is configured to generate a digital feedback signal indicative of a phase difference between the output signal and a reference input signal. The DPLL-DFB is configured to feed-back the digital feedback signal for controlling the oscillator. The DPLL-DC is coupled to the DPLL-DFB and is configured to monitor events depending at least on the digital feedback signal transferred on the DPLL-DFB.

22 Claims, 10 Drawing Sheets

(56) References Cited

U.S. PATENT DOCUMENTS

| | | | |
|---|---|---|---|
| 2010/0156459 A1* | 6/2010 | Plants | H03L 7/104 326/39 |
| 2010/0182060 A1* | 7/2010 | Fujino | H03L 7/085 327/159 |
| 2013/0156129 A1* | 6/2013 | Li Puma | H04L 27/367 375/296 |
| 2013/0287065 A1* | 10/2013 | Sun | H04L 27/2032 375/146 |
| 2014/0152354 A1* | 6/2014 | McLeod | H03L 7/06 327/117 |
| 2014/0292386 A1* | 10/2014 | Toriumi | H03K 23/662 327/156 |
| 2014/0347109 A1* | 11/2014 | Rey | H03L 7/087 327/159 |
| 2014/0368242 A1* | 12/2014 | Unruh | H03L 1/00 327/156 |
| 2015/0194971 A1* | 7/2015 | Tsai | G04F 10/005 327/142 |
| 2015/0207514 A1* | 7/2015 | Kim | H03L 7/08 455/73 |
| 2015/0312078 A1* | 10/2015 | Bogdan | H03L 7/00 375/226 |
| 2017/0141857 A1* | 5/2017 | Casagrande | H03F 3/245 |
| 2018/0006616 A1* | 1/2018 | Avivi | H04L 27/227 |
| 2018/0152192 A1* | 5/2018 | Tsai | H03L 7/0995 |
| 2018/0183567 A1* | 6/2018 | Yoo | H04L 7/0331 |
| 2018/0191302 A1* | 7/2018 | Saric | G01S 13/343 |
| 2018/0254882 A1* | 9/2018 | Bogdan | H03L 7/0995 |
| 2018/0302096 A1* | 10/2018 | Kuan | H03L 7/0891 |
| 2019/0049557 A1* | 2/2019 | Kamimura | G01S 13/34 |
| 2019/0058480 A1* | 2/2019 | Kuan | H03L 7/24 |
| 2019/0214997 A1* | 7/2019 | Meninger | H03L 7/0812 |
| 2019/0230304 A1* | 7/2019 | Moore | H03M 1/1245 |
| 2019/0268008 A1* | 8/2019 | Khoury | H03L 7/0995 |
| 2019/0305781 A1* | 10/2019 | Tsutsumi | H03C 3/00 |
| 2019/0305785 A1* | 10/2019 | Chillara | H03L 7/1075 |
| 2020/0004990 A1* | 1/2020 | Kurd | H03L 7/1976 |
| 2020/0132764 A1* | 4/2020 | Chou | G01R 31/31724 |
| 2020/0287556 A1* | 9/2020 | Huang | H03L 7/091 |
| 2020/0336285 A1* | 10/2020 | Sun | H04J 14/0298 |
| 2021/0044472 A1* | 2/2021 | Dorosenco | H03L 7/087 |
| 2021/0080994 A1* | 3/2021 | Takada | G06F 1/08 |

\* cited by examiner

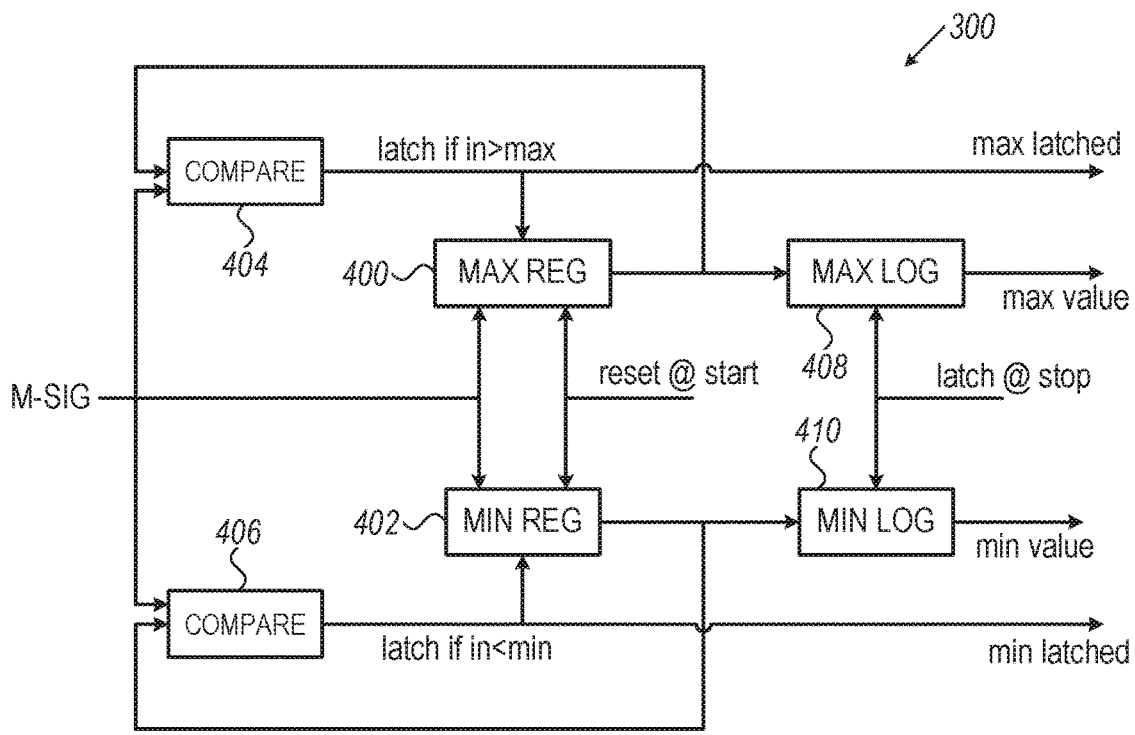
FIG. 4A — EXTREMUM DETECTION CIRCUITRY
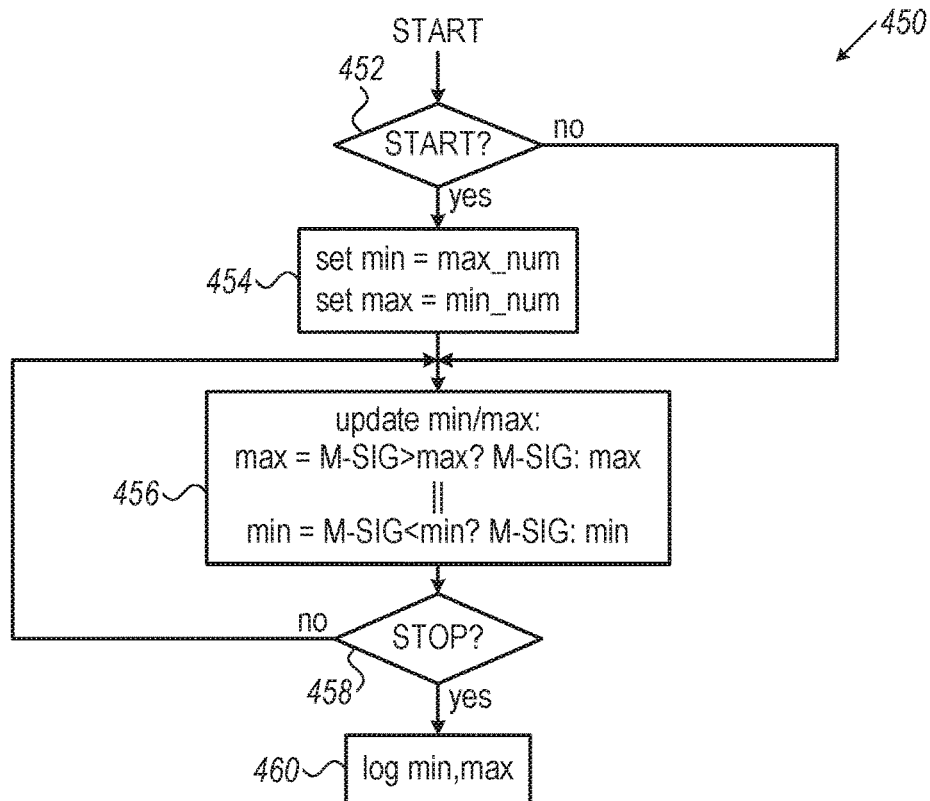
FIG. 4B — EXTREMUM DETECTION FLOWCHART

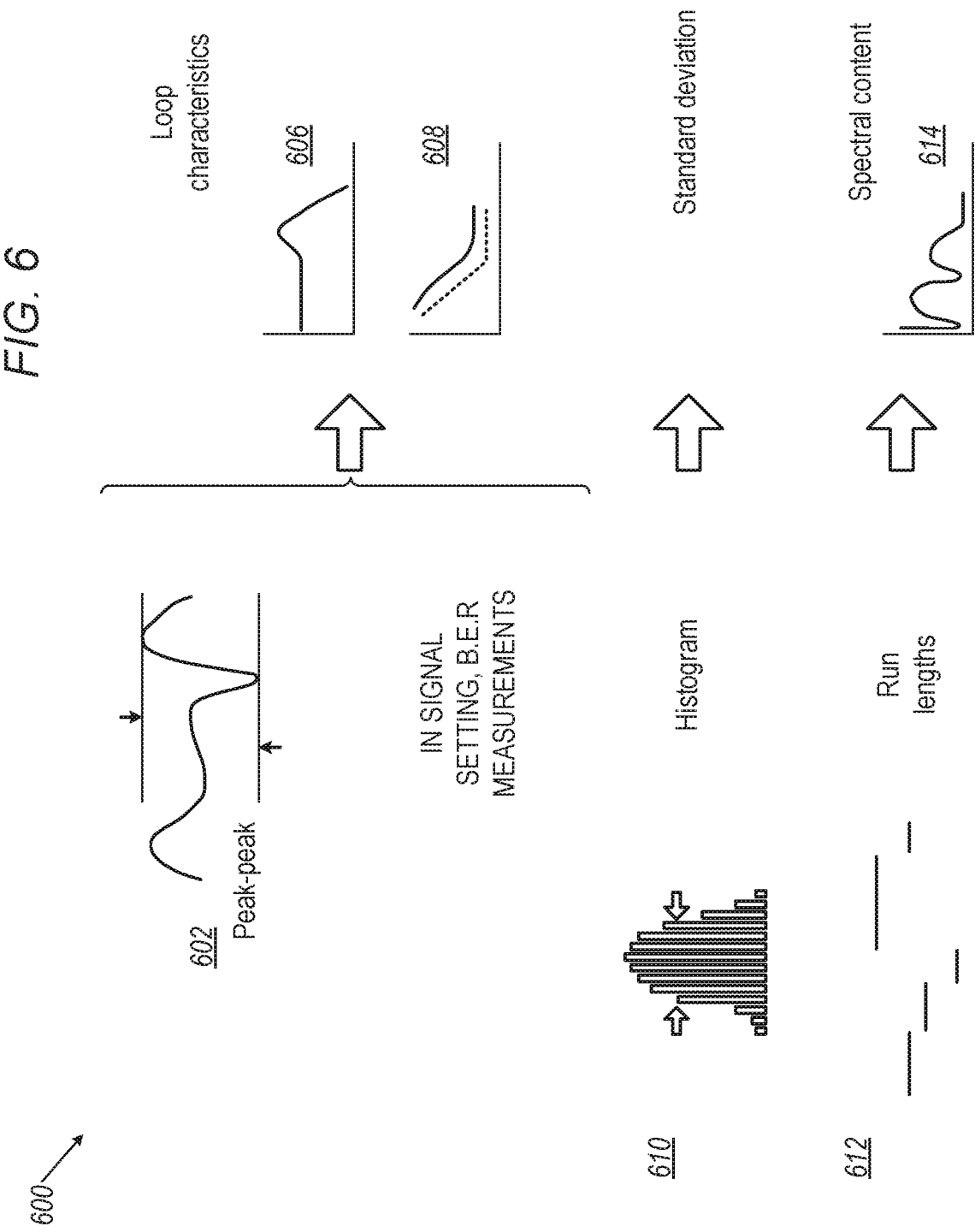

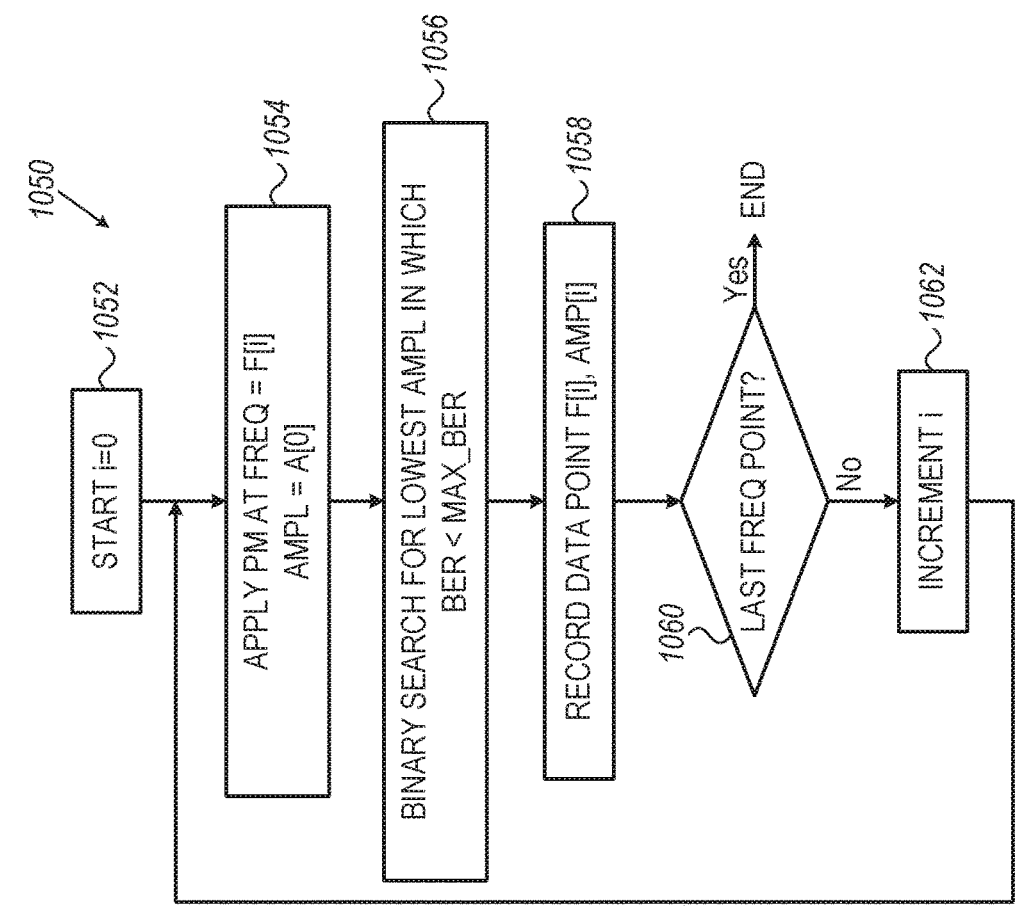
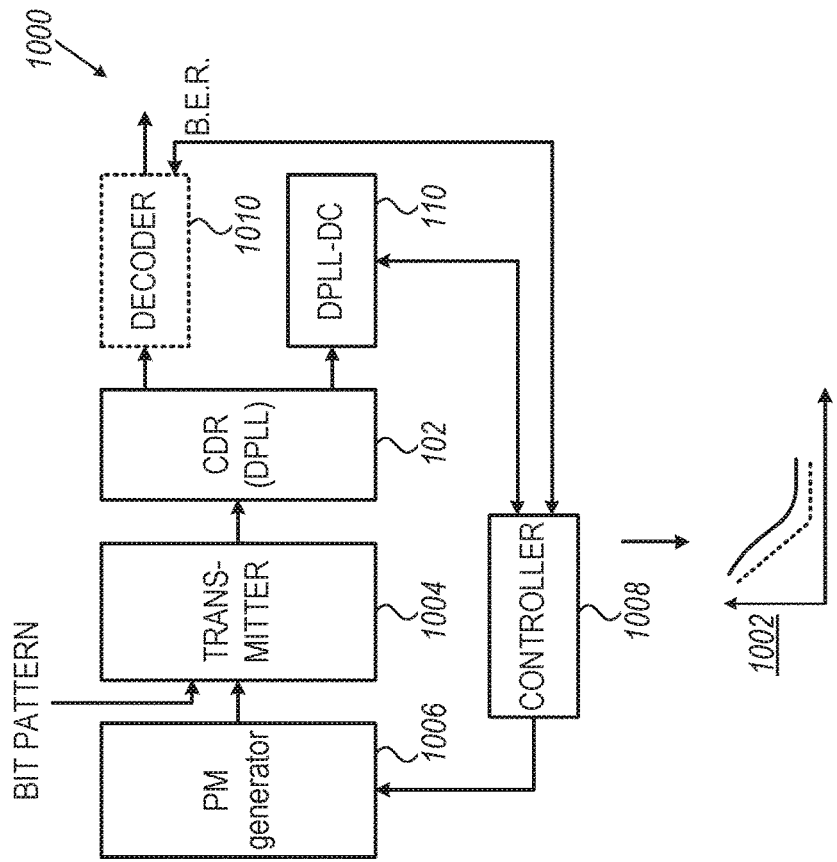
FIG. 10B
FIG. 10A

TEST CIRCUIT FOR A DIGITAL PHASE-LOCKED LOOP

FIELD OF THE INVENTION

The present invention relates generally to digital phase-locked loops, and particularly to on-chip hardware for the testing and characterization of digital phase locked loops.

BACKGROUND OF THE INVENTION

Phase-locked loops (PLLs) are widely employed in radio, telecommunications, computers, and other electronic applications. As the phase-locked loop is a mixed signal circuit, production testing of PLLs may complicate the testing of otherwise digital integrated circuits.

Various techniques for testing PLLs are known in the art. For example, U.S. patent application US 2003/0172327 discloses a method and a device for testing an embedded PLL. A first clock signal of a first frequency is provided to an embedded PLL to be tested by a tester, so as to generate a PLL clock signal by the embedded PLL circuit in response to the first clock signal of the first frequency. The PLL clock signal is input to a test circuit along with a second clock signal of a second frequency. Then, the PLL clock signal is sampled with the second clock signal of the second frequency to generate a first sampled signal. The second frequency has a first correlation with the first frequency. Whether the embedded PLL circuit is in a normal operation condition is determined according to the first sampled signal.

U.S. Pat. No. 6,557,117 describes an on-chip built-in self-test apparatus for a PLL module that resides on an IC, receives a reference clock signal and provides an output clock signal. The apparatus generally comprises a finite state machine and testing circuitry. The finite state machine may be for (i) receiving the reference clock signal and for (ii) producing testing signals for the phase locked loop module. The testing circuitry may be coupled to the finite state machine for (i) receiving the output clock signal, (ii) determining whether the characteristics of the output clock signal meet a predetermined criteria for open and close loop phase locked loop module operation, and (iii) outputting a test signal that indicates proper phase locked loop module operation if the characteristics of the output clock signal meet the predetermined criteria.

SUMMARY OF THE INVENTION

An embodiment of the present invention that is described herein provides an Integrated Circuit (IC) including a digital phase-locked loop (DPLL) circuit and DPLL Diagnostics circuitry (DPLL-DC). The DPLL circuit includes an oscillator, a digital phase detector and a digital feedback bus (DPLL-DFB). The oscillator is configured to generate an output signal. The digital phase detector is configured to generate a digital feedback signal indicative of a phase difference between the output signal and a reference input signal. The DPLL-DFB is configured to feed-back the digital feedback signal for controlling the oscillator. The DPLL-DC is coupled to the DPLL-DFB and is configured to monitor events depending at least on the digital feedback signal transferred on the DPLL-DFB.

In some embodiments, the DPLL-DC is configured to monitor the events at a full bandwidth of the digital feedback signal. In an embodiment, the DPLL-DFB is configured to transfer additional information in addition to the digital feedback signal, and the DPLL-DC is configured to monitor one or more of the events depending on the additional information.

In a disclosed embodiment, the DPLL-DC includes an accumulator that is configured to accumulate numerical values transferred on the DPLL-DFB. In an example embodiment, the DPLL-DC includes event detection circuitry that is configured to detect events on the DPLL-DFB and accumulated numerical events in the accumulator. In another embodiment, the DPLL-DC includes an extremum detection circuitry configured to detect events characterized by extremum values on the DPLL-DFB. In yet another embodiment, the DPLL-DC includes a cycle duration counter, configured to count time durations of the events.

In still another embodiment, the DPLL-DC includes a masked bin comparator, configured to mask one or more lines of the DPLL-DFB with a specified mask, and to compare the masked lines to a specified value. In another embodiment, the DPLL-DC is configured to log a histogram of at least some of the events. In an embodiment, the DPLL-DC is configured to log a bin run-length of at least some of the events.

There is additionally provided, in accordance with an embodiment of the present invention, an Integrated Circuit (IC) including a digital phase-locked loop (DPLL) circuit and DPLL Diagnostics circuitry (DPLL-DC). The DPLL circuit is configured to receive over a communication channel a carrier that is phase-modulated with main-channel data and frequency-modulated with auxiliary-channel data, and to restore a clock and the main-channel data from the carrier. The DPLL-DC is coupled to the DPLL and includes an accumulator and an event detection circuitry, configured to demodulate the auxiliary-channel data.

There is also provided, in accordance with an embodiment of the present invention, a method including operating a digital phase-locked loop (DPLL) circuit. The operating includes generating an output signal using an oscillator, generating, using a digital phase detector, a digital feedback signal indicative of a phase difference between the output signal and a reference input signal, and feeding-back the digital feedback signal over a digital feedback bus (DPLL-DFB), for controlling the oscillator. Using DPLL Diagnostics circuitry (DPLL-DC), which is coupled to the DPLL-DFB, events are monitored depending at least on the digital feedback signal transferred on the DPLL-DFB.

There is further provided, in accordance with an embodiment of the present invention, a method including, using a digital phase-locked loop (DPLL) circuit, receiving over a communication channel a carrier that is phase-modulated with main-channel data and frequency-modulated with auxiliary-channel data, and restoring a clock and the main-channel data from the carrier. The auxiliary-channel data is demodulated using DPLL Diagnostics circuitry (DPLL-DC), which is coupled to the DPLL and includes an accumulator and an event detection circuitry.

The present invention will be more fully understood from the following detailed description of the embodiments thereof, taken together with the drawings in which:

BRIEF DESCRIPTION OF THE DRAWINGS

FIG. 4A is a block diagram that schematically illustrates the structure of an extremum detection circuit, in accordance with an embodiment of the present invention;

FIG. 4B is a flowchart that schematically illustrates a method for extremum detection in accordance with an embodiment of the present invention;

FIG. 6 is a pictorial symbolic view of events and statistical characteristics that suitable software analyzing the DPLL-DC may compute and display, in accordance with an embodiment of the present invention;

FIG. 10A is a block diagram that schematically illustrates a test setup for the measurement of a loop jitter tolerance diagram, in accordance with an embodiment of the present invention;

FIG. 10B is a flowchart that schematically illustrates a method for computing the loop jitter tolerance curve, in accordance with an embodiment of the present invention.

DETAILED DESCRIPTION OF EMBODIMENTS

Overview

Figure 1:
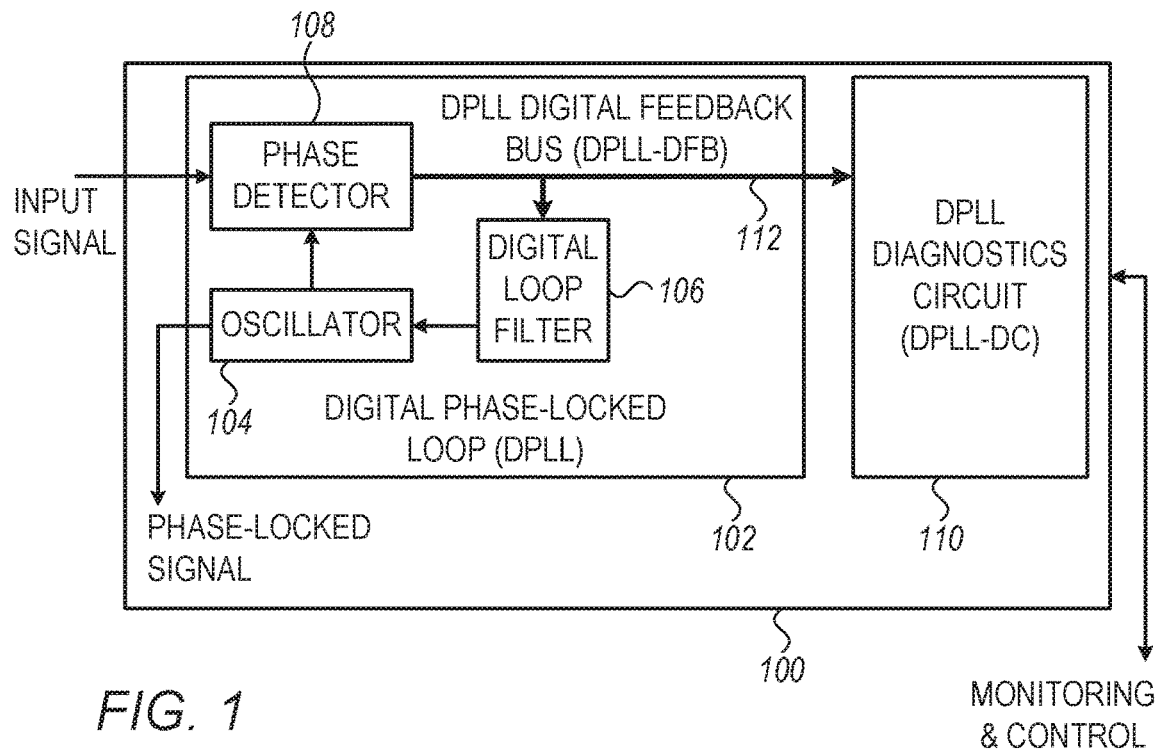
FIG. 1 is a block diagram that schematically illustrates an Integrated Circuit (IC) comprising a Digital Phase-Locked Loop (DPLL) and a DPLL Diagnostics Circuit (DPLL-DC), in accordance with an embodiment of the present invention.

High-frequency Digital Phase-Locked Loops (DPLLs) are complex mixed-signal circuits. As a result, the characterization and diagnostics of DPLLs that are embedded in integrated circuits (ICs) traditionally require complex lab equipment; the production testing of such DPLLs, in wafer-sort or in assembly-test, are often limited to little beyond basic functionality.

Embodiments of the present invention that are disclosed herein provide apparatuses and methods for the testing, characterization and diagnostics of embedded DPLLs using additional circuitry that is added to the IC. In the present context, the term "DPLL" refers to a PLL comprising an oscillator, a digital phase detector and a loop filter, wherein the phase detector produces a raw digital feedback signal (a stream of digital words) whose values are indicative of the phase difference between the signal at the output of the oscillator and an input signal; the loop-filter applies digital filtering (e.g., low-pass) to the raw digital feedback signal, and forwards the filtered feedback to a phase control input of the oscillator. The digital feedback signal is used for controlling the phase of the oscillator, typically after suitable filtering, thereby locking the output of the oscillator on the input signal.

The digital feedback signal may be "indicative of the phase difference" in various ways. In one example embodiment the values of the digital feedback signal are proportional to the phase difference, or to a desired phase correction derived from the phase difference. In another example embodiment the values of the digital feedback signal are proportional to a time derivative of the phase difference or of the desired phase correction. Generally, the digital phase detector may generate any other suitable digital feedback signal.

In some embodiments, the phase detector outputs the digital feedback signal on a digital feedback-bus (DPLL-DFB) of the DPLL. The phase detector may further output any other suitable information on the DPLL-DFB, whether for the operation of the DPLL or for diagnostic purposes.

In embodiments, an on-chip DPLL diagnostics circuit (DPLL-DC) is coupled to the digital feedback-bus (DPLL-DFB) of the DPLL; the DPLL-DC is configured to monitor the DFB at high speed, count preset or pre-programmed events and forward the results to processing, either by an external processor or by the IC.

Clock and Data Recovery (CDR) circuits are typically based on a PLL, and high speed CDRs may be based on DPLLs. Hence, the descriptions hereinbelow may be applicable to CDRs that are implemented using DPLLs.

In some embodiments, the DPLL-DC comprises a Mask circuit, which is configured to select a subset of the signal lines of the DPLL-DFB; an Accumulator, which is configured to accumulate values of signals in the DPLL-DFB; an Event Detector, which is configured to detect and measure events in the accumulator and in the DPLL-DFB; a Counters unit, which is configured to count events and time periods; and a Control-Firmware (Control-FW), which is configured to control the operation of the DPLL-DC.

In an embodiment, the Event Detector comprises extremum-detection circuits, which are configured to detect maximum and minimum values of the accumulated (or the non-accumulated) DPLL-DFB values; an In-range detection circuit, which is configured to indicate when DPLL-DFB signal values or accumulator values are within preset limits; and a masked bin comparator, which is configured to indicate when a preselected maskable bin range is detected. In some embodiments, the counter is configured to count events or time periods of evets that are detected by the Event-Detector.

In an embodiment, the In-Range-Detector is configured to indicate when a signal (from the Accumulator or directly from the DPLL-DFB) is within preset limits. According to some embodiments, the Control-FW may set the In-Range Detection mode of operation to either: i) always indicate when the signal is within two limits ("any-edge"); ii) indicate when the signal is within two limits while the signal level is increasing ("rising-edge"); iii) indicate when the signal is within the two limits while the signal level is decreasing ("falling-edge"); or, iv) start an indication when the signal value reaches a limit while the signal value is increasing and end the indication when the signal level reaches the same limit at the next time that the signal level is increasing ("full-cycle").

In embodiments, the masked-bin comparator may be configured to sequentially change a range value ("bin") and detect when the signal is within the range; the counter may be configured to measure the time duration in which the signal is within each range, and a suitable software (running on a processor in the same IC or external to the IC) may compute a bin histogram of the distribution of ranges of the signal, or a bin run-length view of the time periods in which the signal level is within each of the ranges.

In other embodiments, a control processor, typically external to the IC, may be configured to modulate the carrier phase at a frequency of a transmitter that is coupled to the DPLL through the communication link. By applying variable phases to the carrier frequency, and by measuring the peak-to-peak level using the extremum detector, the controller may compute a jitter transfer function of the communication link.

In yet another embodiment, the transmitter is configured to send a high speed data stream on the communication link; the DPLL is a CDR; and, a communication decoder in the IC is configured to provide the controller with bit-error-rate (BER) measurements of the link. By applying variable phases and variable amplitudes to the carrier frequency, and by comparing the BER results to preset thresholds, the controller may compute a jitter-tolerance function of the communication link.

Lastly, in an embodiment, the techniques described hereinabove may be used to provide a high-speed communication link with a low-speed auxiliary channel. A transmitting IC may comprise a low-speed modulation circuit that sends low-baud-rate data by modulating the phase of a high-speed transmitter that transmits a high bit rate on a main channel; the DPLL-DC in the receiving IC may be configured to demodulate the carrier frequency at the DPLL, and decode the auxiliary channel.

Thus, according to embodiments of the present invention, various test, diagnostics, and characterization functions of a DPLL may be possible by adding simple logic to the IC and, in some cases, by modulating the Tx that is coupled to the DPLL. As a result, production tests such as wafer-sort and assembly-test may be more comprehensive; link parameters may be optimized in real time and ICs with embedded DPLLs may be diagnosed and characterized inexpensively. In another embodiment the same techniques may be used to provide a communication link that transmits a high-speed primary channel with an auxiliary low speed channel, with minimal effect on the performance of the main channel.

System Description

FIG. 1 is a block diagram that schematically illustrates an Integrated Circuit (IC) 100 comprising a Digital Phase-Locked Loop (DPLL) and a DPLL Diagnostics Circuit (DPLL-DC), in accordance with an embodiment of the present invention. IC 100 comprises a DPLL 102, which generates a phase-locked signal that is locked to a phase of an input signal. DPLLs are used, for example, to generate a clock signal to be used by IC 100, and for Clock-Data Recovery (CDR) in high speed communication links.

DPLL 102 comprises a digitally controlled oscillator (DCO) 104, which is configured to generate an oscillating signal; a phase detector 108, which is configured to compare the phase of the oscillating signal generated by oscillator 104 and the phase of an external input signal and to output a digital feedback signal on a digital feedback bus (DPLL-DFB) 112, which typically comprises between 10 and 20 bits; and, a digital loop filter 106, which is configured to apply digital filtering to the digital feedback signal on DPLL-DFB 112. The output of filter 106 is used for controlling the phase of oscillator 104, thereby phase-locking the output of oscillator 104 on the input signal.

As would be appreciated, the configuration of DPLL 102 described hereinabove is a non-limiting configuration given purely by way of example. DPLL structures may vary; for example, in some DPLLs the phase detector may be configured to compare phases generated by frequency dividers that divide the frequency of the oscillator and/or the input signal. The disclosed techniques are applicable to any suitable DPLL configuration.

To ease and simplify the characterization, diagnostics and production testing of IC 100, the IC further comprises a DPLL Diagnostics Circuit (DPLL-DC) 110, which is coupled to DPLL-DFB 112 and configured to carry out full-bandwidth signal diagnostics functions (as would be appreciated, in high-speed DPLLs with oscillation frequencies of 1 GHz or beyond, monitoring of the DPLL-DFB by a remote processor without sub-sampling is, if at all possible, hard, and may consume a significant amount of power).

DPLL-DC 110 is configured to detect events in DPLL-DFB 112, to count and to measure time durations of the detected events and, in embodiments, to monitor other parameters, which may be required to extract characterization parameters of the DPLL. In embodiments, DPLL-DC 110 is further configured to output the diagnostics log to an external bus, which may also be used to configure the DPLL-DC. In some embodiments, monitoring and control of the DPLL-DC is done by a processor external to the IC; in other embodiment, the monitoring and control is done by a processor embedded in the IC, and in yet other embodiments the monitoring and control of DPLL-DC 110 is done partly by an on-IC processor and partly by and off-IC processor.

Thus, according to the example embodiment illustrated in FIG. 1, on-chip diagnostics of a DPLL can be achieved by a DPLL diagnostics circuit, which is embedded in the IC and analyzes the high speed DPLL-DFB at full bandwidth (i.e., at the full bandwidth of the digital feedback signal), without subsampling.

As would be appreciated, the structure of IC 100 described above is cited by way of example. ICs in accordance with the disclosed techniques are not limited to the description hereinabove. For example, in some embodiments DPLL 102 may be embedded in a Clock and Data Recovery (CDR) circuit; in an embodiment, a single DPLL-DC may be coupled to more than one DPLL, and in another embodiment, the DPLL-DC may monitor additional DPLL signals, e.g., from the Digital-Loop Filter.

Figure 2:
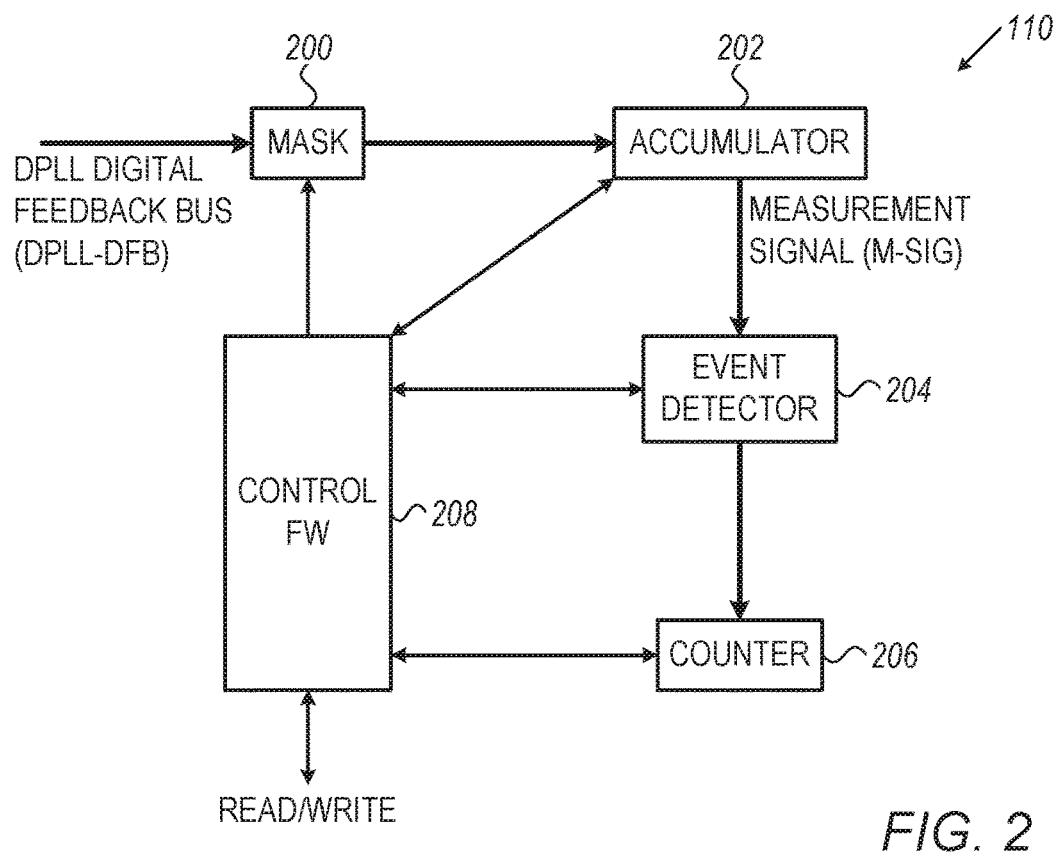
FIG. 2 is a block diagram that schematically illustrates the structure of a DPLL-DC, in accordance with an embodiment of the present invention.

FIG. 2 is a block diagram that schematically illustrates the structure of DPLL-DC 110, in accordance with an embodiment of the present invention. DPLL-DC 110 comprises a Mask unit 200, which is configured to selectively mask signal lines (e.g., corresponding to selected bits of the digital feedback signal) from the DPLL-DFB; an Accumulator 202, which is configured to accumulate signal values of unmasked DPLL-DFB signals (i.e., accumulate values of the digital feedback signal); An Event Detector 204, which is configured to detect events that occur at the accumulated signal values; a Counter 206, which is configured to count events and time durations; and a Control Firmware (FW) 208, which is configured to control the operation of the DPLL-DC and to forward the results to a processor (either a processor that is embedded in the IC, or an external processor).

Accumulator 202 may be controlled to pass accumulated and non-accumulated signals to event detector 204; for example, the states of Finite-State-Machines (FSMs) are typically not accumulated but, rather, transferred as-is to the event detector. Values of the digital feedback signal, on the other hand, may be accumulated before transferal to event detector 204. The output from the accumulator is referred to hereinbelow as a Measurement Signal (M-SIG).

As would be appreciated, the structures of DPLL-DC 110 described above is cited by way of example. DPLL-DCs in accordance with the disclosed techniques are not limited to the description hereinabove. For example, in some embodiments more than one accumulator may be used for the concurrent accumulation of more than one signal. Similarly, Counter 206 may comprise a plurality of counters, for the concurrent counting of a plurality of events and time periods.

Figure 3:
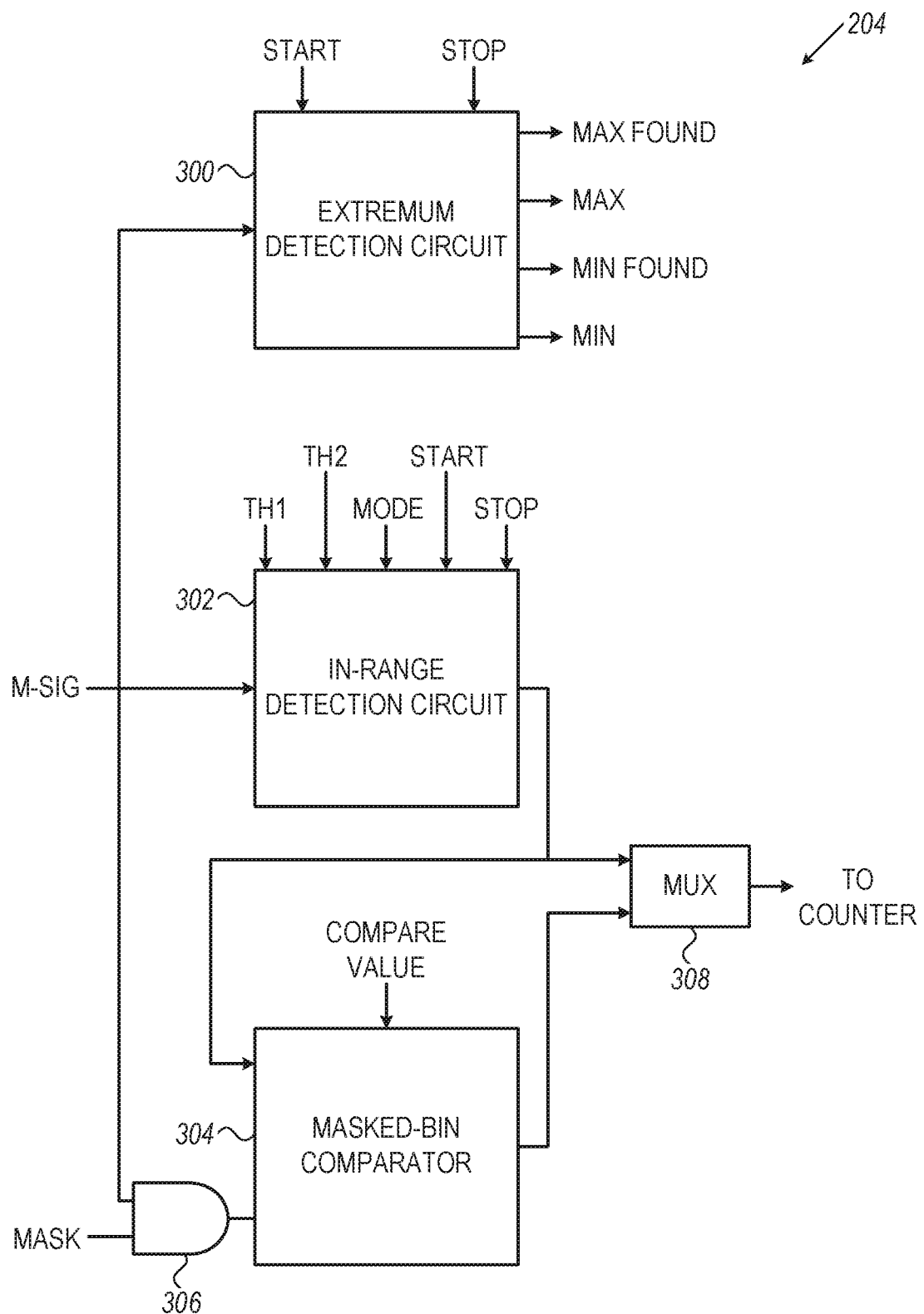
FIG. 3 is a block diagram that schematically illustrates the structure of an event detector, in accordance with an embodiment of the present invention.

FIG. 3 is a block diagram that schematically illustrates the structure of event detector 204, in accordance with an embodiment of the present invention. The event detector comprises an Extremum Detection Circuit 300, an In-Range detection circuit 302, and a Masked-Bin comparator 304, all coupled to M-SIG—the output of accumulator 202 (FIG. 2). Extremum Detection Circuit 300 is configured to monitor an input, detect a minimum and a maximum value of M-SIG when a minimum or a maximum is reached, and output the minimum and maximum values. A Start input resets the extremum detection circuit, and a stop input freezes the last found minimum and maximum values (the start and stop signals are typically generated by Control-FW 208, FIG. 2).

In-range detector circuit 302 is configured to indicate the time-period in which M-SIG is between two values, in a rising slope, a falling slope, in any slope or in a full cycle of the signal, according to a preselected mode input. Lastly, masked-bin comparator 304 is configured to indicate when the value of a selected (masked) set of M-SIG bits, selected by an AND gate 306, assumes a preset value. In some embodiments, the masked-bin comparator may be coupled to the output of In-Range-Detector 302 to receive a bin range rather than a bin and indicate when the value is within the selected range.

According to the example embodiment illustrated in FIG. 3, Event Detector 206 further comprises a multiplexor 308, which is configured to output either the indication of in-range circuit 302 or the indication of masked-bin comparator 304, to counter 206 (FIG. 2).

As would be appreciated, the structures of event detector 204 described above is cited by way of example. Event Detectors in accordance with the disclosed techniques are not limited to the description hereinabove. For example, multiplexor 308 may be missing if separate counters are allocated to in-range detector circuit 302 and to masked-bin comparator 304, to allow concurrent counting of the indications of both units; other detection circuits may be used, for example to compare time derivatives of signals to preset threshold, and others.

FIG. 4A is a block diagram that schematically illustrates the structure of extremum detection circuit 300, in accordance with an embodiment of the present invention. The extremum detection circuit comprises a max-reg 400, a min-reg 402, a high comparator 404, a low comparator 406, a max-log register 408 and a min-log register 410. Max-Reg 400 and Min-Reg 402 are configured to store the detected maximum and minimum values of M-SIG, respectively. Upon receipt of a Start signal, both the max-reg and the Min-Reg are reset (typically the max-reg is reset to the minimum possible value, whereas the min-reg is reset to the maximum possible value; e.g., if M-SIG is a 32-bit two's complement signed number and each register comprises 32 bits, the Start signal will reset max-reg to 0x80000000 and the min-reg to 0x7FFFFFFF).

High-Comparator 404 compares the stored value in Max-Reg 404 to M-SIG and generates a latch signal if M-SIG is greater than the max-reg, which will then latch the new value. In a similar manner, Low-Comparator 406 compares Min-Reg 404 input to the M-SIG input and controls Min-Reg to latch the M-SIG when the input is less than the value stored in Min-Reg.

When Max-Log register 408 and Min-Log register 410 receive a Stop input (e.g., from FW-Control 208, FIG. 2), the max-log register and the min-log register will latch the values of Max-Reg 400 and Min-Reg 402, respectively. The detected max and min values will then be available for readout, while the max-reg and min-reg may continue to search for further extreme values.

The extremum detection circuit typically outputs two numeric values and two indications. The numeric values —max value and min value, are the data stored in the max-log and the min-log registers, respectively. The two indications are max-latched and min-latched, generated by the high and low comparators, respectively (also used to latch the maximum and minimum values in Max-Reg and Min-Reg).

FIG. 4B is a flowchart that schematically describes a method 450 for extremum detection in accordance with an embodiment of the present invention. Although a flowchart description may imply serial implementation by a processor or other sequential logic, it should be noted that the speed requirement associated with the diagnostics of fast DPLLs typically prohibits sequential implementation. Rather, the method illustrated in FIG. 4B is an alternative view of the logic circuit illustrated in FIG. 4A, presented as a flowchart executed by Extremum Detection Circuit 300.

The flowchart starts at a check-start step 452, wherein the extremum detection circuit checks if a start signal is active. If so, the extremum detection circuit enters a set-min-max step 454 and sets a max value to a minimum possible value (e.g., assuming 32-bit two's complement numbers, 0x8000000) and sets a min value to a maximum possible value (e.g., 0x7FFFFFF). After step 454 (or, if no start is received in step 452), the extremum detection circuit enters an update-min-max step 456, wherein the extremum detection circuit updates the max value if the current M-SIG value is greater than the max value, and updates the min value if the current M-SIG value is smaller than the min value.

After step 456 the extremum detection circuit enters a check-stop step 458 and checks if a stop signal is received. If so, the extremum detection circuit enters a log-min-max step 460 and register the max value and the min value, and the flowchart ends. If, in step 458, the extremum detection circuit does not receive a stop signal, the extremum detection circuit will reenter step 456, and continue to look for new min and max values.

As would be appreciated, the structure of extremum detection circuit 300 described above, with reference to FIGS. 4A, 4B, is cited by way of example. Extremum detectors in accordance with the disclosed techniques are not limited to the description hereinabove. For example, in some embodiments the extremum detection circuit may be configured to find a maximum and/or a minimum value of the difference between two consecutive values of the input signal.

In-Range Detection Circuit 302 (FIG. 3) typically comprises two comparators that compare M-SIG to the two thresholds TH1, TH2, and a simple state-machine. In some embodiments the in-range detection circuit is configured to have a plurality of operation modes, such as mark in-range when the input is rising, mark in-range when the input is falling, mark in-range at any edge of input and mark a complete cycle. FIGS. 5A, 5B, 5C and 5D are timing diagrams that illustrate the operation of In-Range Detection Circuit 302 in the various modes of operation. In various embodiments, the structure of in-range detector 302 is trivial, and, hence, will not be described.

Figure 5B:
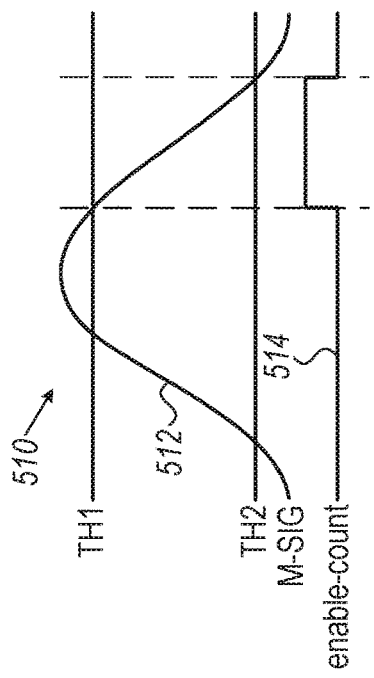
FIG. 5B is a timing diagram that schematically illustrates the operation of an in-range detection circuit in a falling edge configuration, in accordance with an embodiment of the present invention.
Figure 5D:
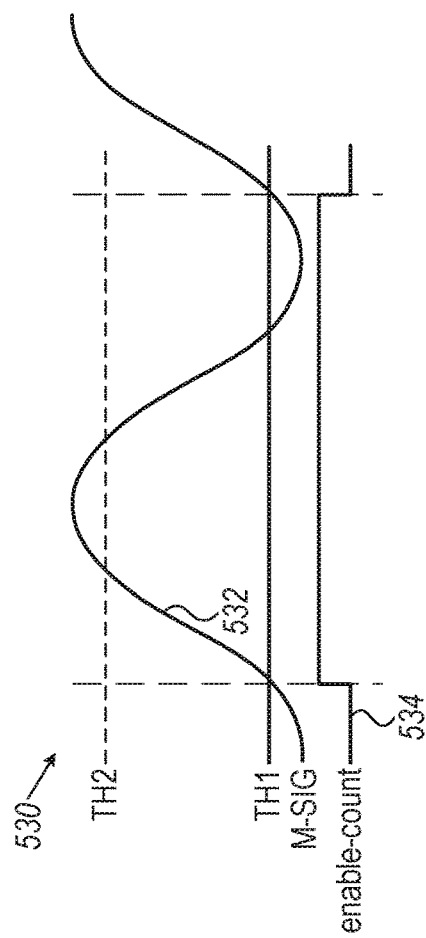
FIG. 5D is a timing diagram that schematically illustrates the operation of an in-range detection circuit in a full-cycle configuration, in accordance with an embodiment of the present invention.
Figure 5A:
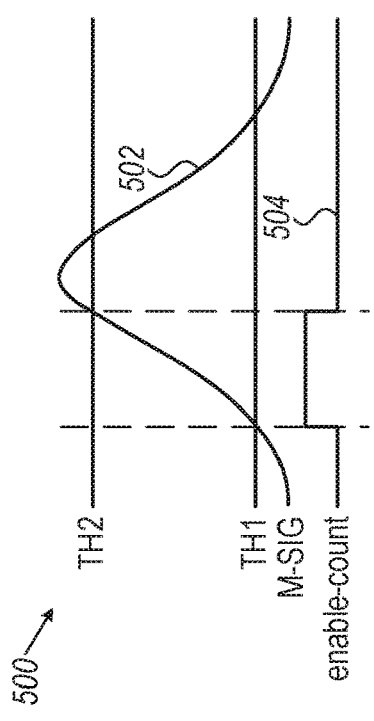
FIG. 5A is a timing diagram that schematically illustrates the operation of an in-range detection circuit in a rising edge configuration, in accordance with an embodiment of the present invention.

FIG. 5A is a timing diagram 500 that schematically describes the operation of in-range detection circuit 302 in a rising-edge configuration, in accordance with an embodiment of the present invention. An M-SIG signal 502 oscillates between a level below TH1 to a level above TH2 (only one cycle is shown in FIG. 5A). The in-range-detection circuit, when in the rising edge configuration, sets an Enable-Count output 504 high when M-SIG equal TH1 in the rising edge of M-SIG, and sets the Enable-Count output low when M-SIG equals TH2, again, in the rising edge of M-SIG. The in-range-detection circuit ignores the points where M-SIG equals TH1 and M-SIG equals TH2 at the falling edge of M-SIG. In an embodiment, Enable-Count is, thus, operable to control timer 206 (FIG. 2) to measure the rising time of M-SIG, from TH1 to TH2.

FIG. 5B is a timing diagram 510 that schematically describes the operation of in-range detection circuit 302 in a falling-edge configuration, in accordance with an embodiment of the present invention. An M-SIG signal 512 oscillates between a level below TH1 to a level above TH2 (again, only one cycle is shown). The in-range-detection circuit, when in the falling edge configuration, sets an Enable-Count output 514 high when M-SIG equal TH2 in the falling edge of M-SIG, and sets the Enable-Count output low when M-SIG equals TH1, again, in the falling edge of M-SIG. The in-range-detection circuit ignores the points where M-SIG equals TH1 and M-SIG equals TH2 at the rising edge of M-SIG. In an embodiment, Enable-Count is, thus, operable to control timer 206 to measure the falling time of M-SIG, from TH1 to TH2.

Figure 5C:
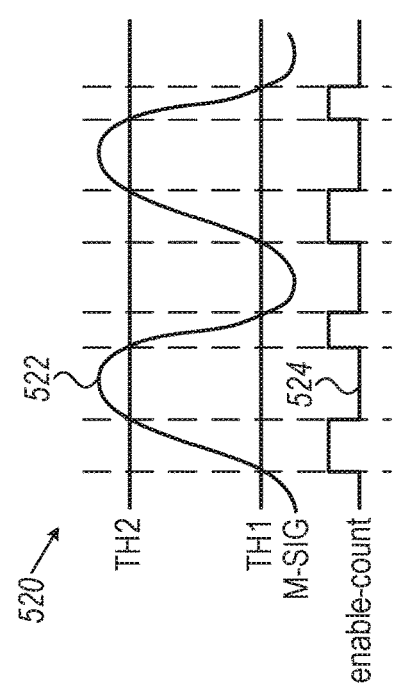
FIG. 5C is a timing diagram that schematically illustrates the operation of an in-range detection circuit in an any-edge configuration, in accordance with an embodiment of the present invention.

FIG. 5C is a timing diagram 520 that schematically describes the operation of in-range detection circuit 302 in an any-edge configuration, in accordance with an embodiment of the present invention. An M-SIG signal 522 oscillates between a level below TH1 to a level above TH2 (two cycles are shown). The in-range-detection circuit, when in the any-edge configuration, sets an Enable-Count output 524 high whenever M-SIG value is between TH1 and TH2, irrespective of the edge of M-SIG 522. In an embodiment, Enable-Count is, thus, operable to count time periods or occurrences wherein M-SIG is within a preset range.

FIG. 5D is a timing diagram 530 that schematically describes the operation of in-range detection circuit 302 in a full-cycle configuration, in accordance with an embodiment of the present invention. An M-SIG signal 532 oscillates between a level below TH1 to a level above TH2 (only 1.5 cycles are shown). In-range detection circuit 302 sets an Enable-Count 534 high when, at the rising edge of M-SIG, M-SIG equals TH1, and sets Enable-Count low when, in the next cycle, M-SIG equals TH1, again, in the rising edge of M-SIG (TH2 is ignored in this configuration). In an embodiment, Enable-Count is, thus, operable to control timer 206 (FIG. 2) to measure the cycle of M-SIG, from TH1 to TH1.

As would be appreciated, the operation of in-range detection circuit 302 illustrated in FIGS. 5A, 5B, 5C and 5D is cited by way of example and, for conceptual clarity, various details are omitted. For example, in some embodiments, Control-FW 208 (FIG. 2) may send a Start indication to the in-range detection circuit; responsive to the start indication, the in-range detection circuit may, in an embodiment, start to continuously monitor the M-SIG signal and to toggle the enable-count output as described above. In another embodiment, responsive to the start indication, the in-range detection circuit may detect the first in-range occurrence and drive the enable-count output only once. In yet another embodiment there is no start indication (or else a start indication is ignored) and the in-range detection circuit continuously monitors the M-SIG signal and toggles the enable-count output. In some embodiments, the Control-FW further sends a Stop indication to the in-range detection circuit, which may, responsive to the stop indication, stop toggling the enable-count output and/or stop monitoring the M-SIG signal.

FIG. 6 is a pictorial symbolic view 600 of events and statistical characteristics that suitable software analyzing DPLL-DC 110 may compute and display, in accordance with an embodiment of the present invention. A peak-detection icon 602 symbolically describes the low-peak and the high peak of the M-SIG signal, as detected, for example, by extremum detection circuit 300 (FIG. 3); the low peak and high peak values may be used to calculate the peak-to-peak voltage of M-SIG.

By repeating a series of amplitude measurements, and by manipulating a transmitter that generates the IN signal, an external computer (either in the same IC or outside the IC) can derive the jitter response characteristics of the DPLL in terms of amplitude (represented by a jitter response icon 606). By repeating a series of amplitude measurements, manipulating the transmitter that generates the IN signal and checking the Bit-Error-Rate (BER) of the received data stream, the external computer may derive the jitter response characteristics of the DPLL in terms of jitter tolerance (represented by a jitter tolerance icon 608).

By repeating a series of bin selection and occurrence frequency measurements (using masked-bin comparator 304 and counter 206; FIGS. 3 and 2), the external computer, may further compute and display an histogram (symbolically represented by a histogram icon 610), from which the standard deviation may be computed.

By repeating a series of bin selection and time-in-bin measurements, the computer can also compute and display a run-length (symbolically represented by a run-length icon 612); from the run-length, the computer may also calculate and display the spectral content (symbolically represented by a spectral-content icon 614) of the DPLL DFB.

More details on loop characteristics, histogram and run-length calculations will be provided below.

Figure 7B:
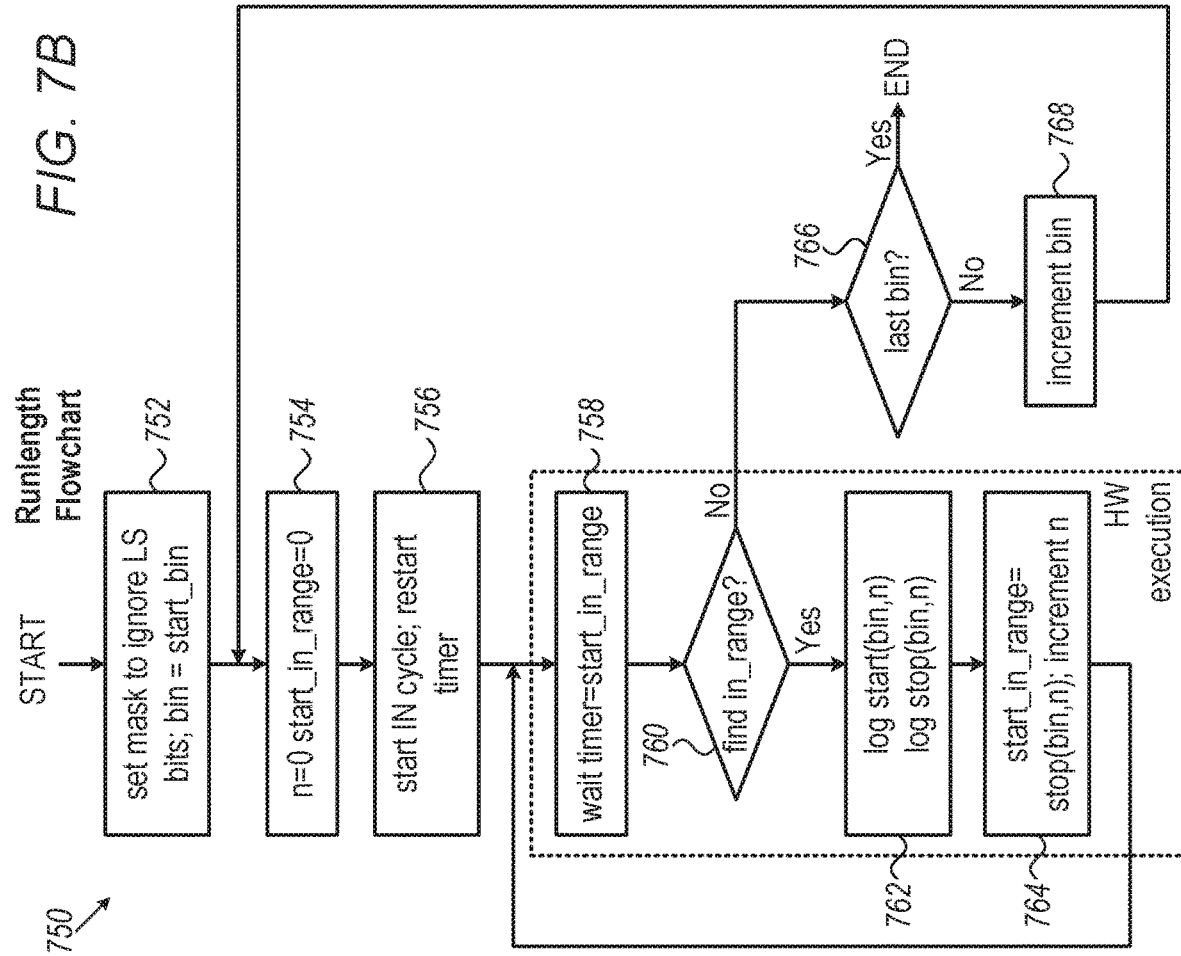
FIG. 7B is a flowchart that schematically illustrates a method for Run-length analysis of a DPLL-DFB, in accordance with an embodiment of the present invention.
Figure 7A:
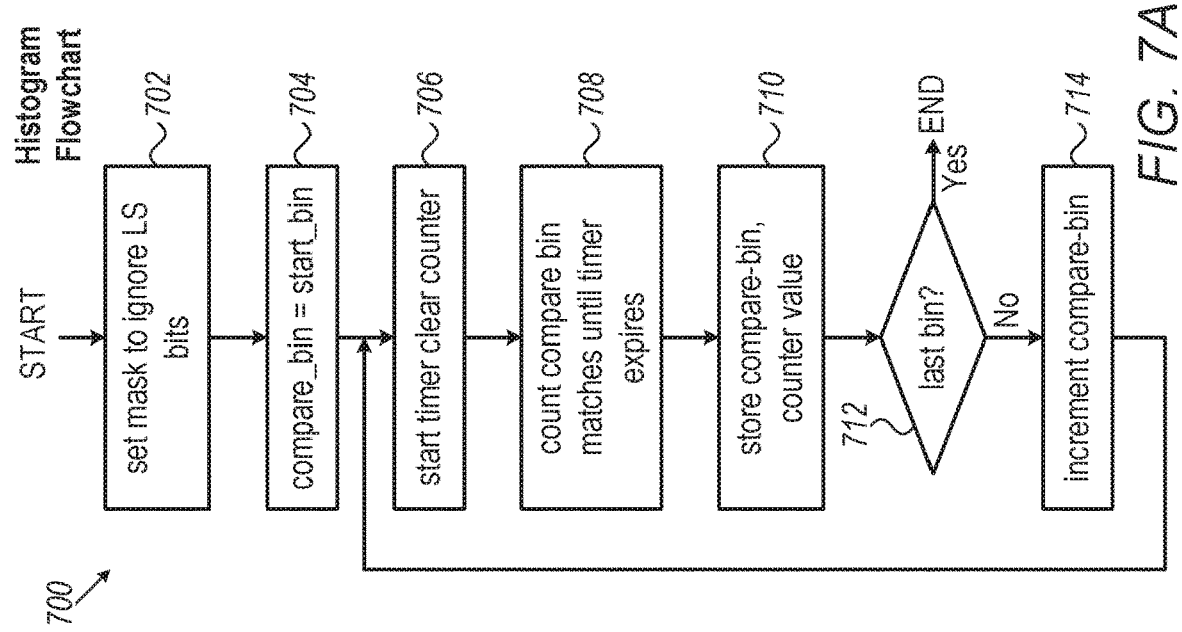
FIG. 7A is a flowchart that schematically illustrates a method for calculating the histogram of a DPLL-DFB, in accordance with an embodiment of the present invention.

FIG. 7A is a flowchart 700 that schematically describes a method for calculating the histogram of a DPLL-DFB, in accordance with an embodiment of the present invention.

The flow is executed jointly by an external computer (in the IC or external) that is coupled to DPLL-DC 110 (FIG. 1) and by Control-FW 208 (FIG. 2). In the description hereinbelow we will refer to the external computer and the control-FW collectively as "the processor".

The flow starts at a Set-Mask step 702, wherein the processor sets the mask bits of Masked-Bin Comparator 304 (FIG. 3) to ignore M-SIG bits that are not relevant to histogram computation. Next, in a Set-Start Bin step 704, the processor will set a Compare-Bin value of the Masked-Bin Comparator to the start bin of the histogram (it should be noted that, in embodiments wherein Masked-Bin Comparator 304 is configured to detect ranges of value, the term "bin" referred to in step 704 and further steps of flowchart 700 refer to ranges of values, which are collectively referred to as bins).

After step 704, the processor starts a histogram extraction loop. In a Start-Timer step 706, the processor will start a timer to time a preset time-period and clear the value of Counter 206 (FIG. 2). The processor then enters a Count step 708, and count bin matches indicated by the Masked-Bin Comparator, until the timer (that was started in step 706) expires. At that time, the counter stores the number of bin hits in the preset time-period. The processor, at a Store-Results step 710, stores the compare-bin and the count value in memory, and enters a Check-Last-Bin step 712.

If, in step 712, compare-bin is not equal to the last bin, the processor will, in an Increment Compare-Bin step 714, increment the value of Compare-Bin, and then reenter step 706, and start another loop iteration. If, in step 712, Compare-Bin equals the last histogram bin, the flow ends.

FIG. 7B is a flowchart 750 that schematically describes a method for Run-length analysis of a DPLL-DFB, in accordance with an embodiment of the present invention. As every bin may run for more than once in a cycle, calculating the run-length is more complex than calculating the histogram, and involves multiple activations of a test signal in the IN input of the DPLL for each of the bins. It is assumed that the response of the DPLL to each of the multiple activations will be identical or, at least, sufficiently matching, to enable the run-length calculation.

Like histogram flowchart 700, Run-length flow chart 750 is executed jointly by an external computer and by the Control-FW, which will be collectively referred to as "the processor" hereinbelow; the time critical portions of the flowchart, however, are executed by hardware circuitry in the DPLL-DC, which will be referred to as "the HW" below. The parameters that the Run-length flowchart extracts are a series of start-time and stop-time pairs in which M-SIG matches each of the bins. According to the example embodiment illustrated in FIG. 7B, the parameters will comprise a series of start(bin,n) and stop(bin,n) numbers, for each bin and, in each bin, for each separate match period n. According to an embodiment, the HW controls Counter 206 (FIG. 2) to latch current count values when Masked-Bin Comparator 304 (FIG. 3) detects a bin-match start event and a bin-match stop event. In an embodiment, the HW will control the counter to refrain from latching bin-match start and stop events until the counter has reached a start-in-range value, and then latch only the first in-range start and stop events. The start-in-range value may be set (typically by the HW) to the time value of the previous bin-match stop event; thus, consecutive detection of the same start and stop values will be avoided.

The flow starts at a Set-Mask step 752, wherein the processor sets the mask bits of Masked-Bin Comparator 304 (FIG. 3) to ignore M-SIG bits that are not relevant to the Run-length analysis, and sets a Bin variable to the start-bin of the Run-length analysis. The processor then enters a Set-Zero step 754, wherein the processor sets the values of an "n" variable and a Start-In-Range variable to zero.

Next, the processor enters a Start-IN-Cycle step 756, wherein the processor applies a new cycle at the IN input, and restarts a timer, which starts counting time from zero. After step 756, the time-critical part, which is executed by the HW, starts. At a Wait-Timer step 758, the HW waits until the counter reaches the start-in-range value (to avoid recapturing the previously captured bin match events), and then, in a Check-Find-In-Range step 760, checks if another in-range event is detected before the end of the IN cycle. If so, the HW, in a Log-Start-Stop step 762, logs the detected start and stop time values, and, in a Set-Start-In-Range step 764, sets the value of the start-in-range variable to the last stop time value (so that the next in-range event will occur later than the current in-range period), increments n by one and reenters step 758.

If, in step 760, the HW does not find further in-range events, the HW execution stop; the processor enters a Check-Last-Bin step 766 and checks if this is the last bin of the run-length analysis; if so, the flowchart ends (and, a suitable software may display a run-length diagram, and/or, for example, store the run-length results in a suitable database). If, in step 766, there are more bins to analyze, the processor increments the bin variable and reenters step 754.

As would be appreciated, flowcharts 700 and 750, illustrated in FIGS. 7A, 7B are example embodiments that are cited merely for the sake of conceptual clarity. Histogram and Run-Length flowcharts according to the present invention are not limited to the description hereinabove. For example, in some embodiments some of the steps may be executed concurrently; in an embodiments, the processor "pushes" the stored values into a first-in-first-out (FIFO) memory, and a concurrent process reads the FIFO and displays partial histograms and run-length diagrams while the processor collects new data. In some embodiments, any or all the processor execution steps may be executed by suitable hardware circuitry; and in other embodiments any or all the HW execution steps (FIG. 7B) may be executed by firmware. Further, in some embodiments the timer may start at the last event inside the bin, and stop at the first event inside the next bin, thus capturing statistics between bins.

Figure 8:
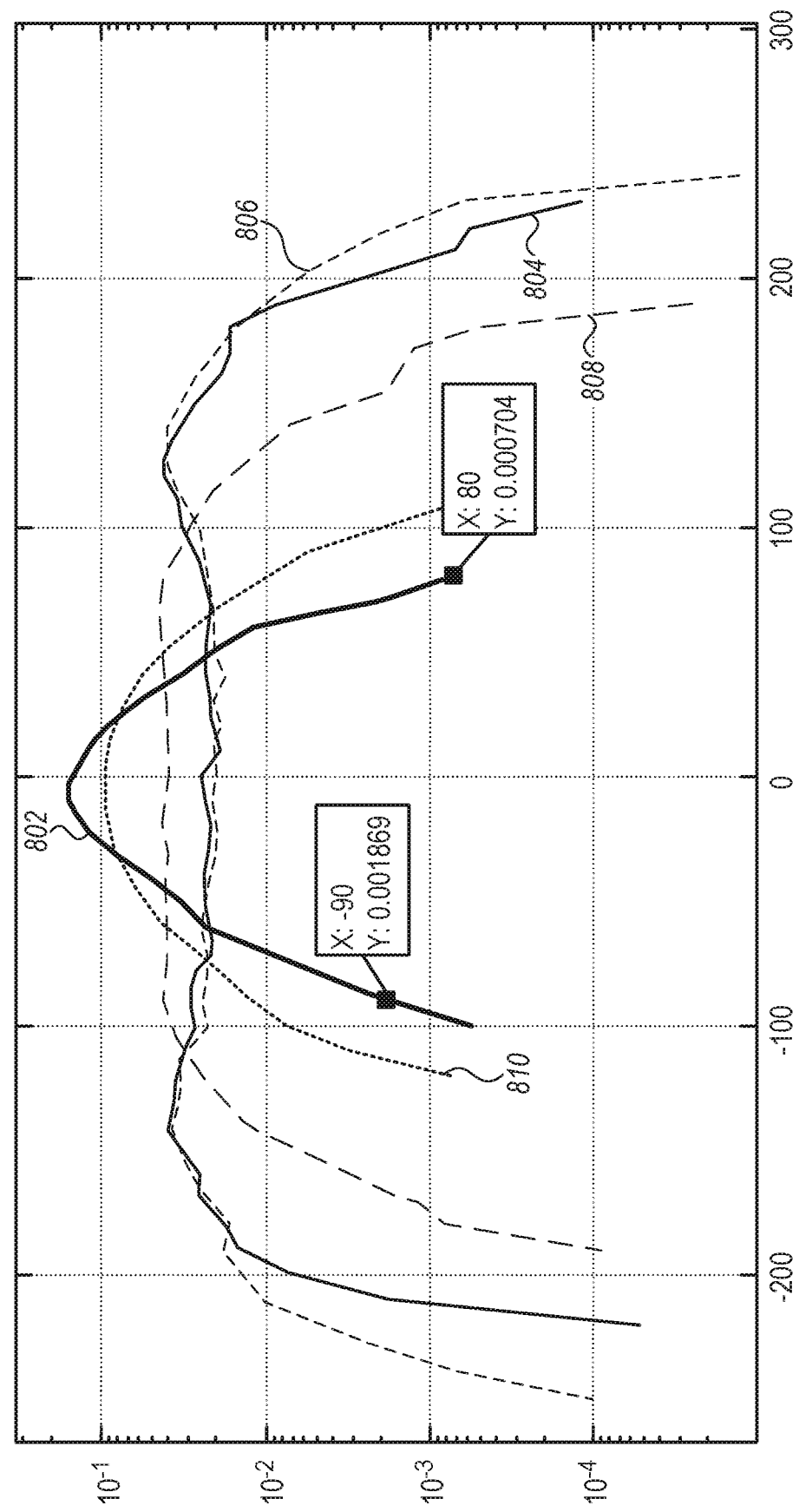
FIG. 8 is a diagram that schematically illustrates a group of histograms, in accordance with an embodiment of the present invention.

FIG. 8 is a diagram 800 that schematically describes a group of histograms, in accordance with an embodiment of the present invention. The histograms presented in FIG. 8 are derived by a method similar to the method of flowchart 700 (FIG. 7A); however, the various histograms illustrated in FIG. 8 are computed when the IN signal is modulated by a sinewave. The modulating sinewave is generated by the off-IC circuit that drives the IN input of phase detector 108 (FIG. 1). The center frequency of IN may be adjusted to the center of the DCO frequency.

The diagram illustrates a histogram 802, which is measured when the IN signal is not modulated; a histogram 804, which is measured when the modulation frequency is 0.5 MHz; a histogram 806, measured when the modulation frequency is 1 MHz; a histogram 808, measured with a 3 MHz modulation frequency; and, a histogram 810, which is measured when the modulation frequency is 8 MHz (all the histograms illustrated in FIG. 8 were derived by simulation of an actual DPLL and an actual DPLL-DC).

The X axis of the diagram is bins of the accumulated value of the up/down pulses (accumulated in Accumulator 202, FIG. 2). Diagram 800 covers 600 bins, from −299 to +300 (a mean value may be subtracted from all bins, to normalize the histograms around 0).

The vertical axis is the relative frequency of each bin. For example, when no modulation is applied (histogram 802), the accumulated value (for the bin width illustrated in FIG. 8) is −90 at 0.1869% of the measurements, and +80 at 0.0704%.

As can be seen, when no modulation is applied, the histogram is narrow—the DPLL only compensates for frequency shifts that may stem from noise coupled by rounding errors of the digital circuitry. When modulation is applied, the histograms widens as the modulation frequency increases (histogram 804, representing 0.5 MHz modulation, and histogram 806, with 1 MHz modulation). However, when the modulation frequency approaches the range of the DPLL response time, the histogram narrows—histogram 808, with 3 MHz modulation is narrower than histogram 804, and the 8 MHz histogram 810 is yet narrower.

Figure 9B:
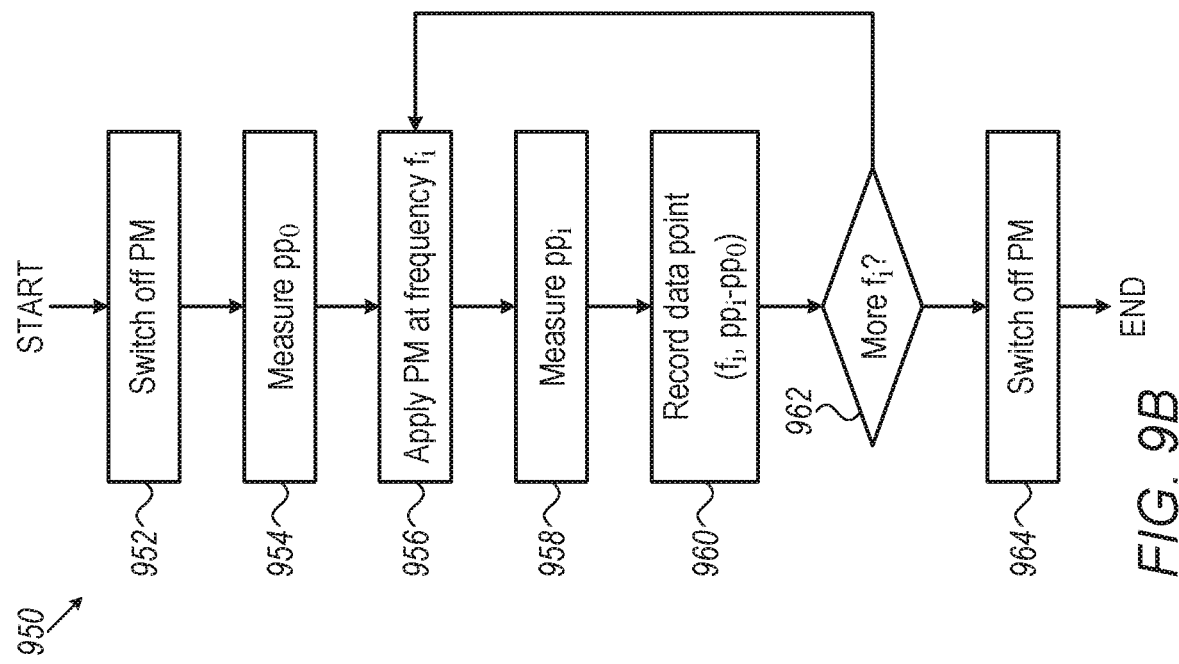
FIG. 9B is a flowchart that schematically illustrates a method for computing the loop jitter transfer curve, in accordance with an embodiment of the present invention.
Figure 9A:
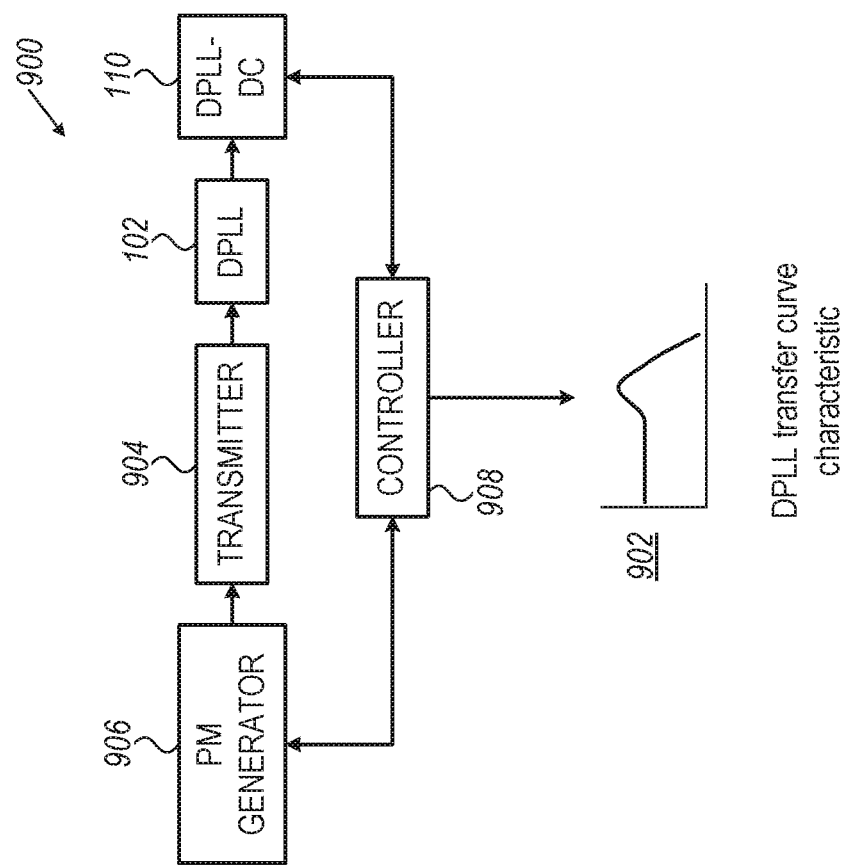
FIG. 9A is a block diagram that schematically illustrates a test setup for the measurement of a loop jitter transfer curve, in accordance with an embodiment of the present invention.

FIG. 9A is a block diagram that schematically illustrates a test setup 900 for the measurement of a loop jitter transfer curve 902, in accordance with an embodiment of the present invention. The setup comprises a transmitter 904, which is phase modulated by a Phase-Modulation (PM) Generator 906; DPLL 102 (FIG. 1) which is configured to lock on the phase of the signal that the Transmitter outputs; DPLL-DC 110 (FIG. 1), which is configured to perform full-bandwidth signal diagnostics functions of the DPLL; and a Controller 908, which is configured to control PM generator 906 and DPLL-DC 110, and to monitor the outputs of DPLL-DC 110. In an embodiment DPLL 102 and DPLL-DC 110 are in IC 100 (FIG. 1), whereas PM generator 906 and Transmitter 904 are in a test device (or, for example, in a test equipment), separate from IC 100. In other embodiments, transmitter 904 and/or PM generator 906 may be embedded in IC 100. Controller 908 may comprise a processor, which is embedded in IC 100 or located outside IC 100, e.g., in a test equipment.

FIG. 9B is a flowchart 950 that schematically illustrates a method for computing the loop jitter transfer curve, in accordance with an embodiment of the present invention. The method is executed by controller 908 (FIG. 9A), in collaboration with Control-FW 208 (FIG. 2); the test setup may be test setup 900 (FIG. 9A).

The method starts at a Switch-PM-Off step 952, wherein the controller controls PM generator 906 to stop generating a modulation signal (e.g., to output a zero-voltage modulation input to Transmitter 920, indicating zero frequency offset). The transmitter will now output a fixed-frequency sinewave, and the DPLL, after a lock delay period, should remain locked to the oscillator frequency. The frequency correction signals (also referred to as "jitter" correction signals) of the DFB will be related mostly to noise and to rounding errors of the DPLL's digital circuits. The Controller, at a Measure-PO step 954, measures the peak-to-peak value of the accumulated jitter correction, by reading Extremum-Detection Circuit 300 (FIG. 3).

The controller then enters the main loop of flowchart 950. In an Apply-PM-Fi step 956, the controller will set PM generator 906 to apply a next modulation frequency Fi to Transmitter 904; in a Measure-PPi step 958, the controller will read the peak-to-peak value of the accumulated jitter from Extremum-Detection Circuit 300; and, in a Record-F-P step 960, will record the Fi and corresponding peak-to-peak values (e.g., store the values in the controller memory). Next, in a Check-Last-F step 962, the controller checks if more frequency points should be measured. If so, the controller reenters step 956, to repeat the loop for the next frequency. If, in step 962, no more measurements are required, the controller will, at a Switch-PM-Off step 964, switch the PM generator off, and end the flowchart. (A suitable software may then be used to display the jitter transfer curve or to store the logged transfer-curve data in memory.)

FIG. 10A is a block diagram that schematically illustrates a test setup 1000 for the measurement of a loop jitter tolerance diagram 1002, in accordance with an embodiment of the present invention. The dashed-line in the jitter tolerance diagram represents a requirement envelope specification, whereas the solid-line curve represents the measured results.

The setup comprises a transmitter 1004, which is configured to encode and transmit a high speed bit pattern; a PM Generator 1006 (which may be equal to PM Generator 906, FIG. 9), configured to modulate the carrier frequency of Transmitter 1004; DPLL 102 (FIG. 1), which is configured as a Clock-Data-Recovery unit (e.g., phase-locks on the signal that the Transmitter outputs and decodes the transmitted data); DPLL-DC 110 (FIG. 1), which is configured to perform full-bandwidth signal diagnostics functions of the DPLL; and Controller 1008, which is configured to control PM generator 1006 and DPLL-DC 110, and to monitor the outputs of DPLL-DC 110.

To calculate the jitter tolerance, an additional input is needed, which indicates the quality of the data-stream that the CDR decodes. In the example embodiment illustrated in FIG. 10, IC 100 comprises a decoder 1010, which is configured to decode the data stream that DPLL 102 restores and measure a Bit-Error-Rate (BER) of the decoding. In some embodiments, the bit-pattern that controller 1008 injects to transmitter 1004 is known, and BER measurement is done by comparing the received data pattern to the transmitted data pattern. In other embodiments, BER can be calculated by counting Cycle-Redundancy-Check (CRC) errors; and in yet other embodiments other suitable BER measurement techniques may be used.

In an embodiment, DPLL 102, DPLL-DC 110 and decoder 1010 are in IC 100 (FIG. 1), whereas PM generator 1006 and Transmitter 1004 are in a test device (or in a test equipment), separate from IC 100. In other embodiments, transmitter 1004 and/or PM generator 1006 may be embedded in IC 100. Controller 1008 may comprise a processor, which is embedded in IC 100 or located outside IC 100, e.g., in a test equipment.

FIG. 10B is a flowchart 950 that schematically illustrates a method for computing the loop jitter tolerance curve, in accordance with an embodiment of the present invention. The method is executed by controller 1008 (FIG. 10A), in collaboration with Control-FW 208 (FIG. 2); the test setup may be test setup 1000 (FIG. 10A).

The flowchart starts at a Reset-i step 1052, wherein the controller sets the value of an i variable, (which is used to count frequency points) to 0. The controller next enters an Apply-PM step 1054, and controls PM generator 1006 to apply a sinewave at a frequency F[i], and at an amplitude A[0], to the Transmitter modulation input. Transmitter 1004 will now transmit a bit pattern (that is input to the transmitter, e.g., from controller 1008); the signal will be received by DPLL 102, which will restore the data and the clock, and forward the data to decoder 1010. Decoder 1010 will decode the data, and compute a BER, which is input to controller 1008.

When the amplitude is low, the BER may be above a preset threshold (e.g., $10^{-8}$); the point on the jitter tolerance curve that corresponds to frequency F[i] is the amplitude in which the BER is equal to the preset threshold. At a Binary-Search step 1056, the controller binary-searches for an amplitude in which the BER equals (or is sufficiently close to) the threshold (for example, according to the comparison of the BER and the threshold, the controller may increase or decrease the amplitude, by a rate which equals half the rate of the previous iteration). In some embodiments, step 1056 may comprise measuring of the amplitude in the DPLL-DC, and verification that the measured amplitude matches the PM generator amplitude set by the Controller.

After the controller finds the amplitude in step 1056, the controller enters a Record-Data-Point step 1058, and records the frequency and amplitude, e.g., in the controller's memory. The controller will now enter a Check-Last-Frequency step 1060; if the current frequency is not the last frequency to be analyzed, the controller will, at an Increment-i step 1062, increment i (thereby pointing to the next analysis frequency), and reenter step 1054. If, at step 1060, the last frequency has been reached, the flow will end. A suitable software may then be used to display the jitter tolerance curve or to store the logged curve data in memory.

The apparatuses and methods described herein may be used to measure and minimize the jitter of DPLLs and CDRs. The jitter may be measured using some or all the techniques described above, including peak-to-peak measurements, histogram analysis and evaluating the jitter tolerance curve. Jitter effect on the system performance can then be minimized by suitable tuning of the DPLL parameters (depending on the DPLL architecture).

According to some embodiments of the present invention, the DPLL-DC may be used to provide low-bit-rate back channel in bidirectional communication, including, for example, optical communication links.

Figure 11:
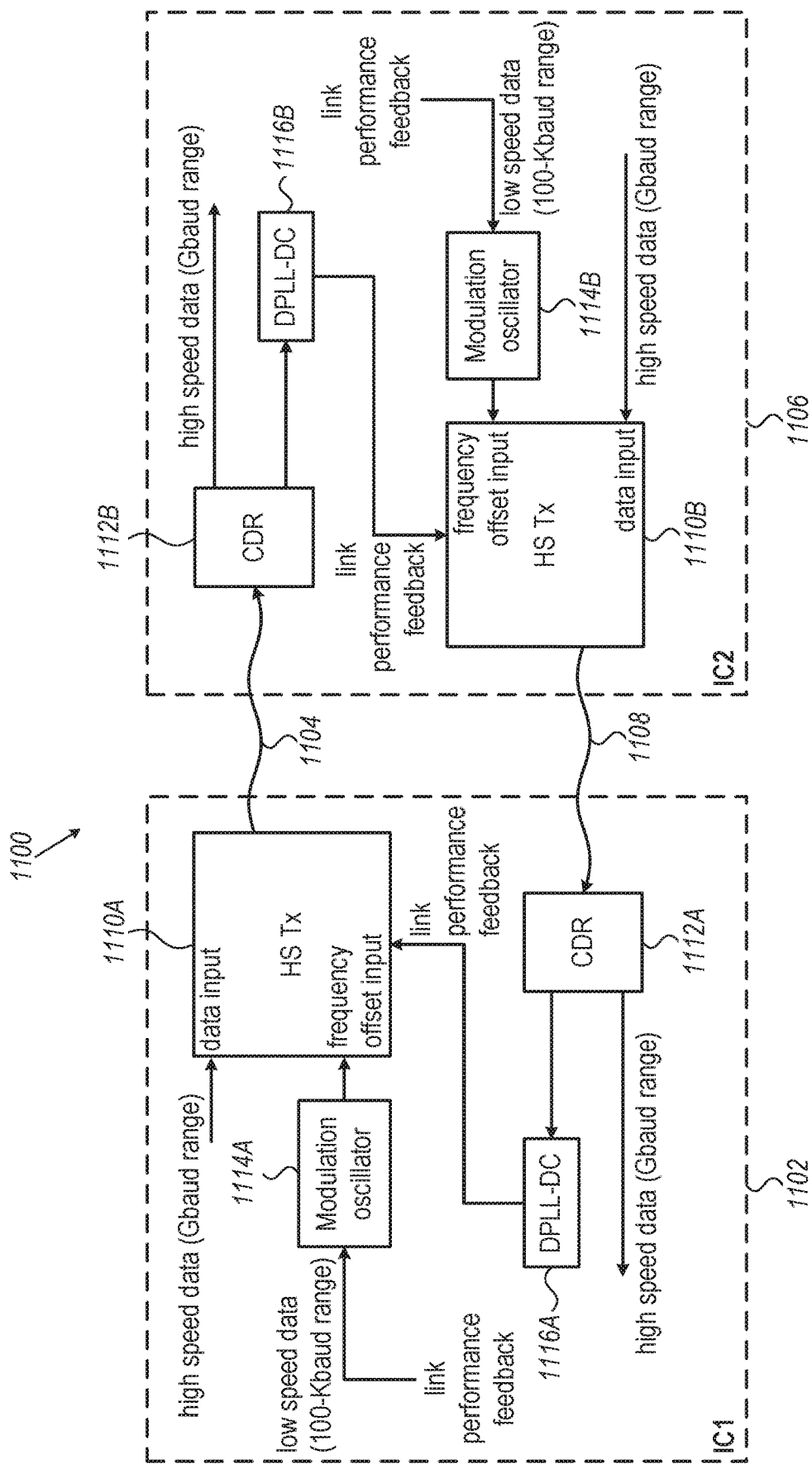
FIG. 11 is a block diagram that schematically illustrates a two-way high-speed communication link, with low-speed back channels, in accordance with an embodiment of the present invention.

FIG. 11 is a block diagram that schematically illustrates a two-way high-speed communication link 1100 with low-speed back channels, in accordance with an embodiment of the present invention. An IC1 1102 sends high-speed data over a link 1104 to an IC2 1106. IC2 sends high-speed data over a link 1108 to IC1. According to the example embodiment illustrated in FIG. 11, IC1 and IC2 are identical with respect to the communication circuits. Links 1104 and 1106 may be, for example, optical links (details such as optical-to-electrical interfaces are omitted for clarity).

IC1 comprises a High-Speed Transmitter (HS-Tx) 1110A and a Clock-Data-Recovery (CDR) 1112A. HS-Tx 1110A sends high-speed data over link 1104 to CDR 1112B, whereas HS-Tx 1110B sends high-speed data over link 1108 to CDR 1112A. The high-speed transmissions are referred to as the main channels of the bidirectional communication link.

In embodiments according to the present invention, additional low speed channels ("auxiliary channels") can be used between IC1 and IC2, using the same link media, without affecting the performance of the main link. In the example embodiment illustrated in FIG. 11, the auxiliary channels are used to transfer link performance feedback, for in-line link optimizations. IC1 further comprises a modulation oscillator 1114A, which is configured to oscillate at a frequency far lower than the high-speed data transfer rate (e.g., the high-speed data rate may be 1.5 Gbps, whereas the modulation oscillator may oscillate at 1 MHz). Modulation oscillator 1114A is further modulated (e.g., at 100 Kbps) to transfer back-channel information. In the example embodiment illustrated in FIG. 11, the back-channel information comprises link performance feedback. Thus, the back-channel information is sent on the same link with the main channel and encoded by frequency changes of the main channel carrier.

Symmetrically, IC2 comprises a modulation oscillator 1114, configured to oscillate at a relatively low frequency; the link performance feedback (corresponding to the line from IC1 to IC2) modulates modulation oscillator 1114B, which modulates the main channel carrier frequency.

IC1 further comprises a DPLL-DC 1116A (and, symmetrically, IC2 comprises a DPLL-DC 1116B), which may be similar or identical to the DPLL-DC units described hereinabove. The auxiliary back-channel can be decoded, for example, by observing peak-to-peak values of the accumulated jitter.

As would be appreciated, the structure of two-way high-speed communication link 1100 described above is cited by way of example. Communication links in accordance with the disclosed techniques are not limited to the description hereinabove. For example, in some embodiments, the link-performance feedback is decoded by AM modulation of the frequency offset of HS-Tx 1110A (and 1110B). In some embodiment, a single auxiliary channel may send link performance information of a plurality of high-speed links. In another embodiment, the auxiliary channel may be used for data other than link performance feedback.

The apparatuses and methods described hereinabove, with reference to FIGS. 1 through 11; the configurations of DPLL-DC 110, including all units and subunits thereof, are example methods and configurations that are shown purely for the sake of conceptual clarity. Any other suitable methods and configurations can be used in alternative embodiments.

In various embodiments, DPLL-DC 110 may be implemented using suitable hardware, such as one or more Application-Specific Integrated Circuits (ASIC) or Field-Programmable Gate Arrays (FPGA), or a combination of ASIC and FPGA.

In some embodiments, any or all of Control-FW 208 controller 908, controller 1008 and the processors which are coupled to Control-FW 208 and described hereinabove comprise, for example, a general-purpose programmable processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Although the embodiments described herein mainly address on-chip hardware for the testing and characterization of digital phase locked loops, the methods and systems described herein can also be used in other applications such as in sigma-delta modulators.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An Integrated Circuit (IC), comprising:
a digital phase-locked loop (DPLL) circuit, comprising:
an oscillator, configured to generate an output signal;
a digital phase detector, configured to generate a digital feedback signal indicative of a phase difference between the output signal and a reference input signal; and
a digital feedback bus (DPLL-DFB) configured to feed-back the digital feedback signal for controlling the oscillator; and
DPLL Diagnostics circuitry (DPLL-DC), which is coupled to the DPLL-DFB and is configured to monitor events depending at least on the digital feedback signal transferred on the DPLL-DFB.

2. The IC according to claim 1, wherein the DPLL-DC is configured to monitor the events at a full bandwidth of the digital feedback signal.

3. The IC according to claim 1, wherein the DPLL-DFB is configured to transfer additional information in addition to the digital feedback signal, and wherein the DPLL-DC is configured to monitor one or more of the events depending on the additional information.

4. The IC according to claim 1, wherein the DPLL-DC comprises an accumulator that is configured to accumulate numerical values transferred on the DPLL-DFB.

5. The IC according to claim 4, wherein the DPLL-DC comprises an event detection circuitry that is configured to detect events on the DPLL-DFB and accumulated numerical events in the accumulator.

6. The IC according to claim 1, wherein the DPLL-DC comprises an extremum detection circuitry configured to detect events characterized by extremum values on the DPLL-DFB.

7. The IC according to claim 1, wherein the DPLL-DC comprises a cycle duration counter, configured to count time durations of the events.

8. The IC according to claim 1, wherein the DPLL-DC comprises a masked bin comparator, configured to mask one or more lines of the DPLL-DFB with a specified mask, and to compare the masked lines to a specified value.

9. The IC according to claim 1, wherein the DPLL-DC is configured to log a histogram of at least some of the events.

10. The IC according to claim 1, wherein the DPLL-DC is configured to log a bin run-length of at least some of the events.

11. An integrated circuit (IC), comprising:
a digital phase-locked loop (DPLL) circuit, which is configured to receive over a communication channel a carrier that is phase-modulated with main-channel data and frequency-modulated with auxiliary-channel data, and to restore a clock and the main-channel data from the carrier; and
DPLL Diagnostics circuitry (DPLL-DC), which is coupled to the DPLL and comprises an accumulator and an event detection circuitry, configured to demodulate the auxiliary-channel data.

12. A method, comprising:
operating a digital phase-locked loop (DPLL) circuit, the operating including:
generating an output signal using an oscillator;
using a digital phase detector, generating a digital feedback signal indicative of a phase difference between the output signal and a reference input signal; and
feeding-back the digital feedback signal over a digital feedback bus (DPLL-DFB), for controlling the oscillator; and
using DPLL Diagnostics circuitry (DPLL-DC), which is coupled to the DPLL-DFB, monitoring events depending at least on the digital feedback signal transferred on the DPLL-DFB.

13. The method according to claim 12, wherein monitoring the events is performed at a full bandwidth of the digital feedback signal.

14. The method according to claim 12, and comprising transferring additional information over the DPLL-DFB, in addition to the digital feedback signal, wherein monitoring one or more of the events depends on the additional information.

15. The method according to claim 12, wherein monitoring the events comprises accumulating numerical values transferred on the DPLL-DFB using an accumulator.

16. The method according to claim 15, wherein monitoring the events comprises detecting events on the DPLL-DFB and accumulated numerical events in the accumulator.

17. The method according to claim 12, wherein monitoring the events comprises detecting events characterized by extremum values on the DPLL-DFB.

18. The method according to claim 12, wherein monitoring the events comprises counting time durations of the events.

19. The method according to claim 12, wherein monitoring the events comprises masking one or more lines of the DPLL-DFB with a specified mask, and comparing the masked lines to a specified value.

20. The method according to claim 12, wherein monitoring the events comprises logging a histogram of at least some of the events.

21. The method according to claim 12, wherein monitoring the events comprises logging a bin run-length of at least some of the events.

22. A method, comprising:
using a digital phase-locked loop (DPLL) circuit, receiving over a communication channel a carrier that is phase-modulated with main-channel data and frequency-modulated with auxiliary-channel data, and restoring a clock and the main-channel data from the carrier; and
using DPLL Diagnostics circuitry (DPLL-DC), which is coupled to the DPLL and comprises an accumulator and an event detection circuitry, demodulating the auxiliary-channel data.

* * * * *